United States Patent [19]

Müller et al.

[11] 4,160,162

[45] Jul. 3, 1979

[54] METHOD FOR THE PICTORIAL DISPLAY OF A DIFFRACTION IMAGE IN A TRANSMISSION-TYPE, SCANNING, CORPUSCULAR-BEAM MICROSCOPE

[75] Inventors: Karl-Heinz Müller; Volker Rindfleisch, both of Berlin, Fed. Rep. of Germany

[73] Assignee: Siemens Aktiengesellschaft, Munich, Fed. Rep. of Germany

[21] Appl. No.: 847,439

[22] Filed: Nov. 1, 1977

[30] Foreign Application Priority Data

Nov. 12, 1976 [DE] Fed. Rep. of Germany ....... 2652273

[51] Int. Cl.$^2$ ............................................ G01N 23/00
[52] U.S. Cl. ................... 250/311; 250/396 R
[58] Field of Search ............................ 250/311, 396

[56] References Cited

U.S. PATENT DOCUMENTS

| | | | |
|---|---|---|---|
| 2,354,263 | 7/1944 | Hillier | 250/311 |
| 3,225,192 | 12/1965 | Katagiri et al. | 250/311 |
| 3,849,647 | 11/1974 | Koike et al. | 250/311 |
| 4,068,123 | 1/1978 | Kokubo | 250/311 |

Primary Examiner—Harold A. Dixon
Attorney, Agent, or Firm—Kenyon & Kenyon

[57] ABSTRACT

An improved method for pictorially displaying a diffraction image in a transmission-type, scanning, corpuscular-beam microscope in which a beam detector is scanned by a diffraction image moved by a deflection system in line-raster fashion in a first, predetermined direction over the beam detector. The beam detector generates an output signal for controlling the brightness of a television monitor which displays the diffraction image. The improvement of the invention comprises the step of additionally exciting the deflection system so as to move the diffraction image in another, second direction over the beam detector which is perpendicular to the first, predetermined direction so that a predetermined area of the diffraction image which includes at least part of the cross-section of the maximum intensity of the null reflex of the beam is excluded during scanning of the beam detector and the diffraction image displayed by the television monitor is blanked in an area corresponding to the cross-section of the diffraction image which is excluded during scanning.

5 Claims, 4 Drawing Figures

METHOD FOR THE PICTORIAL DISPLAY OF A DIFFRACTION IMAGE IN A TRANSMISSION-TYPE, SCANNING, CORPUSCULAR-BEAM MICROSCOPE

BACKGROUND OF THE INVENTION

1. Field of the Invention

This invention relates to a method for pictorially displaying a diffraction image in a transmission-type, scanning, corpuscular-beam microscope in which the diffraction image is moved by deflection means in line-raster fashion in a predetermined direction over beam detector means, the latter of which generates an output signal for controlling the brightness of a television monitor for displaying the diffraction image.

2. Description of the Prior Art

Methods of the foregoing type are known in the art. See, for example, German Offenlegungsschrift No. 2,302,689 and U.S. Pat. No. 3,849,647. In such prior art methods, a scanning electron beam is deflected by means of a deflection system disposed above a specimen to be examined so that the beam always penetrates the specimen in a direction which is perpendicular to the specimen. Such microscopes may include an additional deflection system. If in carrying out such a method, the additional deflection system is not excited, the objective lens of the microscope provides a diffraction image in the plane of the beam detector of the microscope which is always located at the same point regardless the specimen area which is being irradiated. The position of the diffraction image can be changed relative to the beam detector of the microscope by using the additional deflection system. The diffraction image can therefore be moved over the detector in raster fashion and can be successively recorded and displayed.

In another method for changing the position of the diffraction image relative to the beam detector of the microscope known in the prior art, the additional deflection system for deflecting the diffraction image below the objective lens of the microscope is eliminated. To permit this, the deflection system which moves the incident electron beam over the specimen in raster fashion is excited by a signal having a frequency which is higher than the raster frequency so that the electron beam of the microscope no longer penetrates the specimen only in a perpendicular direction but, instead, also penetrates the specimen in an oblique manner, i.e., at different angles with respect to the optical axis of the microscope.

The intensity of the null reflex in the diffraction image is much greater than that of the higher order reflexes of the image. This high intensity of the null reflex can easily cause overloading of the beam detector of the microscope during scanning of the detector by the diffraction image since this intensity decreases only after a recovery time has elapsed, and may even lead to a permanently-lowered detector sensitivity. As a result, a raster image which is heavily infested with noise is obtained.

In order to prevent generation of such a diffraction image, it was previously necessary in both prior art methods described herein to reduce the intensity of the microscope beam so that the null reflex would be imaged properly without overloading the beam detector of the microscope. The disadvantage of this solution to the problem of noise interference, however, is that higher-order reflexes often become so weak in intensity that they can no longer be distinguished from the background in the diffraction image.

SUMMARY OF THE INVENTION

It is therefore an object of the present invention to provide an improved method for pictorially displaying a diffraction image in a transmission-type, scanning, corpuscular-beam microscope which enables the suppression of the intensity peak of the null reflex of the beam of such a microscope without changing the intensity relation of the remainder of the diffraction image.

This and other objects of the invention are achieved in a method for pictorially displaying a diffraction image in a transmission-type, corpuscular-beam microscope in which beam detector means is scanned by a diffraction image moved by deflection means in line-raster fashion in a first, predetermined direction over the beam detector means, the beam detector means generating an output signal for controlling the brightness of a television monitor for displaying the diffraction image. The improvement comprises the step of additionally exciting the deflection means so as to move the diffraction image in another, second predetermined direction over the beam detector means which is perpendicular to the first, predetermined direction so that a predetermined area of the diffraction image including at least part of the cross-section of the maximum intensity of the null reflex of the beam is excluded during scanning of the beam detector and the diffraction image displayed by the television monitor is blanked in an area corresponding to the cross-section of the diffraction image which is excluded during scanning.

The improved method of the invention prevents the interfering intensity peak of the null reflex from being imaged, and the beam detector of the microscope is, accordingly, prevented from becoming overloaded. As a result, a perfect low-noise diffraction image is obtained in which the higher-order reflexes are still imaged. A dark spot is generated only in the area of the null reflex, depending upon the type and size of the area which is excluded from being imaged, i.e., from scanning. If the area excluded is made just large enough so that the interfering portion of the null reflex is excluded but the lower-intensity edge of this null reflex is imaged, then at least the location of the null reflex is unequivocally fixed.

It is also possible to superimpose an additional diffraction image on the diffraction image already generated. This additional image is generated by a lower-beam intensity and has none of the area of the diffraction image excluded from being imaged. The intensity of the null reflex is lowered in this second diffraction image by the lower beam intensity to such an extent that the beam detector of the microscope does not become overloaded. The entire diffraction image is thus obtained by adding substantially only the null reflex to the second image.

It should be noted that the intensity relations of two differently-generated diffraction images will no longer correspond to the actual intensity relations. Frequently, however, only the position of the individual reflexes is important to enable conclusions to be drawn as to the crystal structure which is present and even the material which is present in the specimen examined.

In a preferred embodiment of the method of the invention, the step of additionally exciting comprises additionally exciting the deflection system by a fixed increment in an area of the diffraction image which is defined by the values $x_1 \leq x \leq x_2$ and $y_1 \leq y \leq y_2$, wherein $x_1$, $x_2$, $y_1$ and $y_2$ are predetermined, fixed values in the first, predetermined direction and second, perpendicular direction, respectively. The deflection of the diffraction image in the second, perpendicular direction caused by additionally exciting the deflection system is at least the increment $\Delta y = y_2 - y_1$. Accordingly, the area not scanned in this embodiment of the method of the invention comprises an adjustable window. By imposing the additional condition of a minimum deflection in the second, perpendicular, i.e., y-axis direction, it is assured that the diffraction image will always be deflected within this window through a distance which is sufficient to at least prevent the diffraction image from striking the beam detector of the microscope. Due to the rotational symmetry of the null reflex, it is preferable to provide a square window as the area which is excluded from scanning.

In another preferred embodiment of the method of the invention, the step of additionally exciting further comprises additionally exciting the deflection system by a fixed increment for a fixed period of time. In this embodiment of the method of the invention, in the step of additionally exciting the deflection system may further comprise continuously increasing the additional excitation as long as the intensity at the beam detector means exceeds a predetermined value, and decreasing the additional excitation as soon as the intensity of the beam at the beam detector means decreases to a value which is below the predetermined value.

The method of this latter embodiment of the invention is then carried out as follows:

For a given y-value, i.e., value in the second, perpendicular direction, the diffraction image is scanned over the beam detector in the x-direction, i.e., the first, predetermined direction. If a region of the null reflex of the beam having an intensity which is excessively high strikes the beam detector, the diffraction image is moved, as a result of the additional deflection in the y-direction, such as great distance that it is assured that the null reflex will fall outside the beam detector. The x-deflection continues to be carried out undisturbed during this deflection in the y-direction. After the elapse of a given period of time, the additional deflection in the y-direction is terminated, i.e., the diffraction image returns to its original y-axis position but, of course, to a different x-axis position since the x-axis deflection of the beam continues, as noted above, during the additional deflection time. If the intensity of the beam is still too high at the point which is thus reached, the process is repeated.

The method of the invention is particularly advantageous if the additional excitation is continuously increased when the intensity at the detector exceeds a predetermined value and is reduced as soon as the intensity at the detector again decreases to a value below the predetermined value. In this situation, the intensity peak of the null reflex is attenuated by skirting its reflex at its flank at a height, the intensity of which still just corresponds to the permissible beam intensity. As a result, no more than the low-intensity portion of the null reflex is imaged.

These and other novel features and advantages of the invention will be described in greater detail in the following detailed description.

BRIEF DESCRIPTION OF THE DRAWINGS

In the drawings, wherein similar reference numerals denote similar elements throughout the several views thereof.

DETAILED DESCRIPTION

Figure 1:
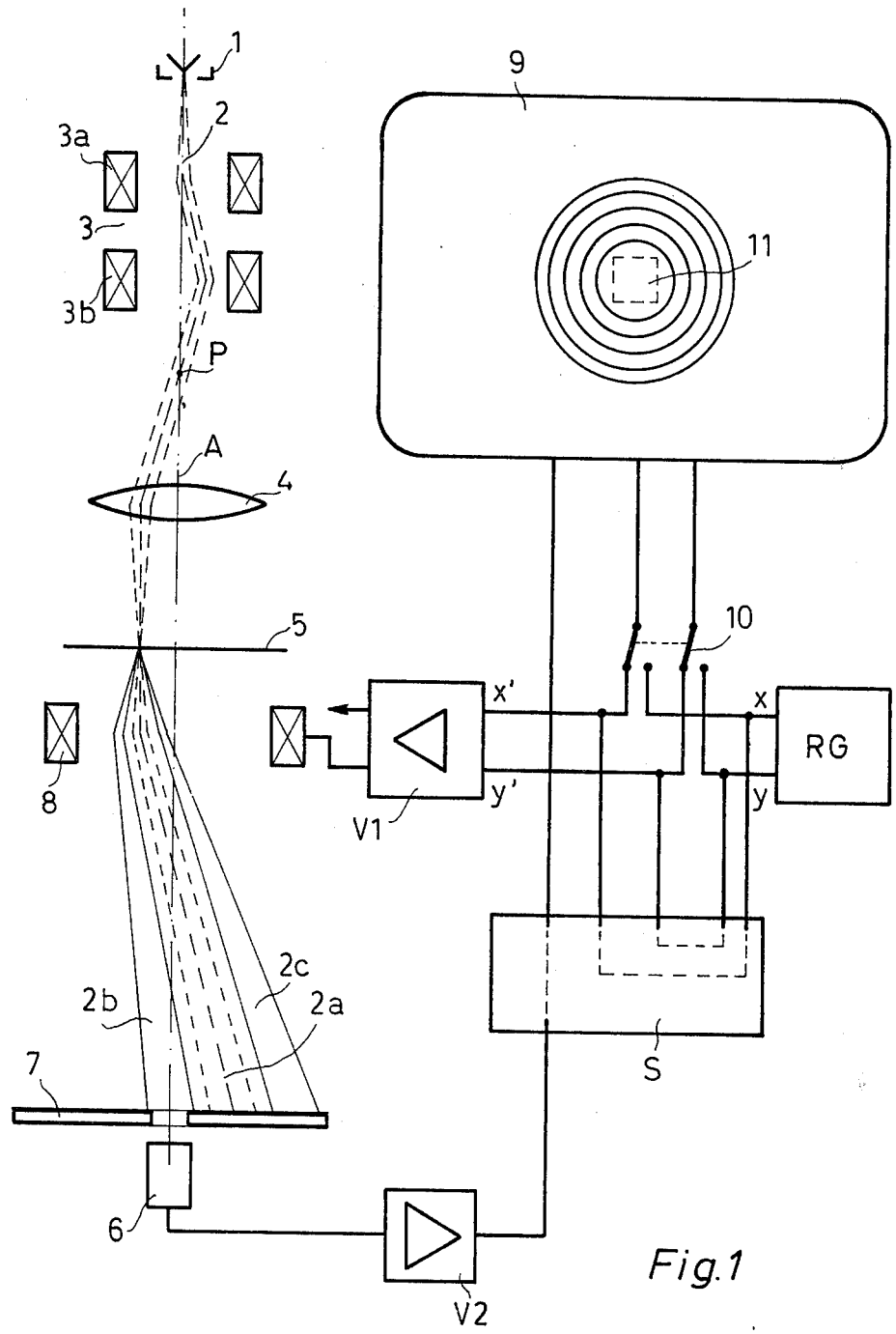
FIG. 1 is a schematic diagram of a transmission-type, scanning, corpuscular-beam microscope for carrying out an improved method of pictorially displaying a diffraction image in such a microscope in accordance with the present invention.

Referring now to the drawings, and in particular to FIG. 1, there is shown a transmission-type, scanning, corpuscular-beam microscope including a beam source 1 which may comprise, for example, a field emission cathode. A deflection system 3 having stages 3a and 3b is provided for linearly deflecting the electron beam 2 of the microscope over a specimen 5 in a raster fashion. Stage 3a of the deflection system directs beam 2 out of the microscope axis A and stage 3b directs the beam back towards the axis. As can be seen in FIG. 1, the deflection system 3 tilts electron beam 2 about a point P which lies in the focal plane of an objective lens 4. Lens 4 may comprise a magnetic objective lens and focuses the beam on the specimen. Since the point P about which tilting of the beam takes place is located at the front focus of the objective lens 4, the electron beam illuminates the specimen perpendicular thereto. Part of the incident electron beam 2 is deflected in the specimen by diffraction in certain directions outside the primary beam cone, i.e., null ray 2a. The portions of the incident electron beam which are diffracted are shown as diffracted rays 2b and 2c.

The microscope includes another, additional deflection system 8 comprising either two pairs of electrostatic deflection plates or magnetic deflection coils. By means of this deflection system, rays 2a, 2b and 2c may be moved in two orthogonal directions x and y over a beam detector 6 so that either the null ray 2a or one of the deflected rays 2b or 2c passes through an aperture in a screen 7 disposed above beam detector 6 and the ray passing through the aperture is registered by the detector. Because the small beam divergence, the diameter of the beam cones in the plane of beam detector 6 and the diameter of the detector entrance area are approximately equal.

Deflection system 8 is excited by means of raster generator RG and an amplifier V1 in such a manner that the diffraction image moves over the detector in Cartesian coordinates. An electronic control circuit S coupled to the raster generator RG and amplifier V1 causes additional deflection of the image in the y-direction in the area which is to be excluded from scanning. The output signals x and y of the raster generator RG are transmitted to the input terminals of electronic control circuit S. The output signals x' and y' of the electronic control circuit correspond to a definite point of the diffraction image. The signal x' is not changed by the electronic control circuit and always corresponds to the output signal x generated by raster generator RG. The signal y' also corresponds in most instances to the value of the signal y, except that in the area which is excluded from scanning the signal y' is increased by the value Δy, i.e., the additional excitation which is necessary to deflect the diffraction image through such a distance that the null reflex of the beam is no longer detected by the beam detector of the microscope. The output signals generated by electronic control circuit S are simultaneously transmitted to the deflection systems which are used to deflect the beam of a television monitor 9 in the x and y directions. By changing the position of a switch 10, the signals x and y, respectively, generated by raster generator RG, can be transmitted directly to the deflection system of the television monitor.

The beam detector 6 of the microscope is coupled by means of an amplifier V2 and electronic control circuit S to the brightness control of television monitor 9. The screen of the television monitor shows a diffraction image comprising a plurality of diffraction rings, i.e., the diffraction image which is produced if a polycrystalline substance is irradiated. Since in accordance with the method of the invention the television monitor is blanked within the area which is excluded from scanning, no null reflex is shown on the monitor in FIG. 1. A square window 11 is illustrated on the monitor in dashed lines and represents a predetermined area which is excluded from scanning.

Figure 2:
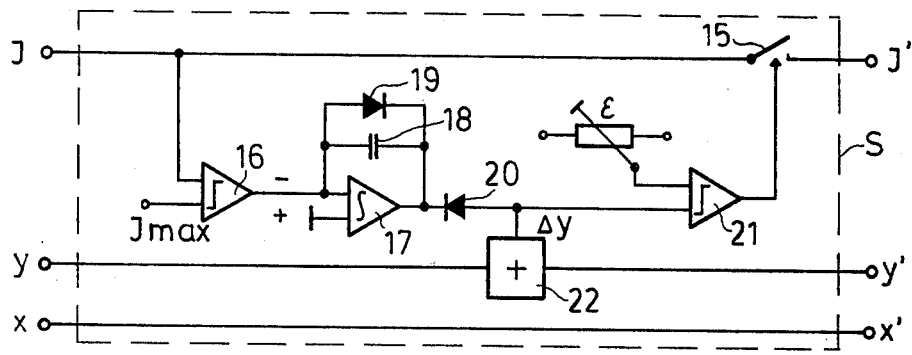
FIG. 2 is a schematic electrical diagram of one embodiment of an electronic control circuit of the microscope illustrated in FIG. 1 for carrying out the improved method of the invention.

FIG. 2 schematically illustrates one embodiment of an electronic control circuit S which enables the null reflex to be skirted on its flank. This electronic control circuit has an input terminal for each of the signals x and y and for an intensity signal I which is transmitted from beam detector 6 through amplifier V2. The circuit also includes output terminals for the signals x', y' and I'.

In this embodiment of the control circuit, input terminal x is directly coupled to output terminal x'. Input terminal I is coupled to a switch 15 and a comparator 16. The output of the comparator is coupled to the input terminal of an integrator 17 whose output terminal is coupled in a feedback loop to the input terminal of the integrator by means of a capacitor 18. Capacitor 18 is further shunted by a diode 19 coupled in parallel relationship with the capacitor. Another diode 20 is coupled to the output terminal integrator 17 and to comparator 21 and an adder 22. Input terminal y of the control circuit is coupled to a second input terminal of adder 22, and the output terminal of the adder is coupled to output terminal y' of the control circuit. An output signal generated by comparator 21 is used to operate switch 15.

The operation of the embodiment of the control circuit shown in FIG. 2 is as follows:

The signal I corresponding to the intensity of the beam detected by beam detector 6 is compared in comparator 16 with a predetermined signal $I_{max}$. As long as the signal I is smaller than $I_{max}$, the comparator remains in a rest condition, in this situation at positive potential. The diode 19 is thereby connected in its conduction direction and shorts capacitor 18 so that the output of integrator 17 is at approximately the same positive potential. In this situation, diode 20 is cut-off so that no additional signal Δy is transmitted to adder 22. The output signal y' is therefore equal to the input signal y. Comparator 21 similarly does not generate an output signal so that switch 15 is closed and input signal I is identical to output signal I'. In this situation, television monitor 9 is modulated bright. If the input signal I then exceeds the predetermined value $I_{max}$, comparator 16 switches to its other state, i.e., in this situation one in which the comparator generates a negative potential at its output terminal. The diode 19 is cut-off in this situation so that integrator 17 becomes operable. The output signal generated by integrator 17 is transmitted by means of diode 20, which is now conducting, as the signal Δy to adder 22, i.e., the input signal y is increased by the amount Δy and forms and output signal y'=y+Δy. The value Δy represents the additional excitation in y by which the diffraction image is deflected through a distance which is sufficient to assure that the disturbing null reflex does not strike the detector. Comparator 21 then compares the Δy value present with a minimun value ϵ. If Δy is ≧ϵ, then switch 15 is opened by means of the output signal generated by comparator 21, i.e., television monitor 9 is blanked. As long as the intensity signal I at the input terminal of comparator 16 is greater than the maximum intensity signal $I_{max}$, the signal Δy increases in magnitude due to the integration and thereby the additional excitation also increases. If this additional excitation has deflected the diffraction image through a distance which is sufficient to cause the detector to generate a signal I which is less than $I_{max}$, then the comparator returns to its original state in which it has a positive potential at its output terminal. Diode 19 then shorts the integrator again and diode 20 becomes nonconducting so that the output signal y' rapidly corresponds again to the input signal y. Overall, the control circuit shown in FIG. 2 provides a control behavior in which the additional deflection of the diffraction image assures that the null reflex is skirted at its flank at a height which is predetermined by $I_{max}$.

Figure 3:
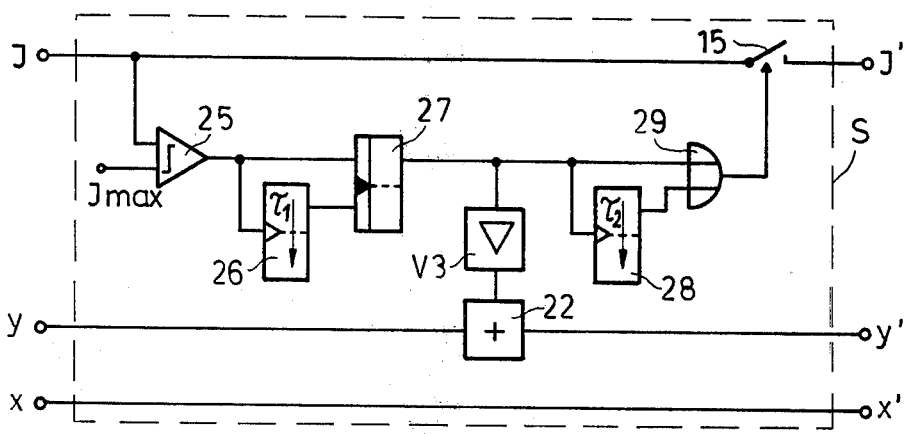
FIG. 3 is a schematic electrical diagram of another embodiment of an electronic control circuit for the microscope of FIG. 1.

Another embodiment of the electronic circuit S is illustrated in FIG. 3. This circuit, similar to that shown in FIG. 2, has three input terminals and three output terminals. The input terminal for the signal x is also directly coupled to the output terminal for the signal x', and the input signal I is transmitted to a switch 15 and a comparator 25. The output signal generated by the comparator 25 is transmitted to the input terminal of a predominantly storing elementary memory 27, i.e., a flip-flop, and to a monostable multivibrator 26 having a time constant $\tau_1$ for its unstable state. The output terminal of multivibrator 26 is coupled to another input terminal of flip-flop 27. The output terminal of this flip-flop is coupled by means of an amplifier V3 to the adder 22 whose other input terminal receives the signal y. The output terminal of flip-flop 27 is coupled to the input terminal of another monostable multivibrator 28 and to the input terminal of an OR gate 29. This OR gate has another input terminal coupled to the output terminal of monostable multivibrator 28. Switch 15 is operated by means of the output signal generated by OR gate 29 at its output terminal.

The operation of the control circuit illustrated in FIG. 3 is as follows.

If the input signal I exceeds the magnitude of the predetermined signal $I_{max}$, a signal is generated at the output terminal of comparator 25. Flip-flop 27 then also generates an output signal which forms the incremental signal Δy for an additional deflection of the diffraction image by means of an amplifier V3. This incremental signal Δy is added to the y-axis signal value in the adder 22. The output signal of comparator 25 simultaneously places monostable multivibrator 26 in its unstable condition. After the elapse of the time period $\tau_1$, monostable multivibrator 26 switches back to its original state. The output signal generated by the multivibrator is transmitted to the other input terminal of flip-flop 27. If the intensity I in the meantime drops again below the magnitude of the signal $I_{max}$, and comparator 25 no longer generates a signal, the output signal of monostable multivibrator 26 again switches the flip-flop 27, i.e., a signal is no longer present at the output, and the signal y' then becomes equal again in magnitude to the signal y. As long as a signal is present at the output terminal of flip-flop 27, switch 15 is opened by means of OR gate 29 and the television monitor is blanked thereby. The monostable multivibrator 28 also blanks for a certain time period, $\tau_2$ if a signal is no longer present at the output terminal of flip-flop 27. $\tau_2$ represents the time during which monostable multivibrator 28 remains in its unstable state. This time period should be longer than the time constant in the intensity measurement.

If the diffraction image is generated by means of such an electronic control circuit, the following occurs:

For a given y-axis value, the diffraction image is scanned over the beam detector in the x-axis direction. If the intensity registered by the beam detector reaches a predetermined, objectionable value, then the diffraction image moves, as a result of an additional excitation, in the y-direction through a distance which is sufficient to assure that the disturbing null reflex is not detected by the beam detector 6. The diffraction image remains in this y-axis position for the period of time $\tau_1$, while the x-axis deflection of the image continues unchanged. After the elapse of time period $\tau_1$, the diffraction image returns to its original y-axis value. If in this position the intensity (which is, of course, located at another x-axis coordinate) is still too large, the process is immediately repeated. Otherwise, the scanning process continues to be carried out in normal fashion.

Figure 4:
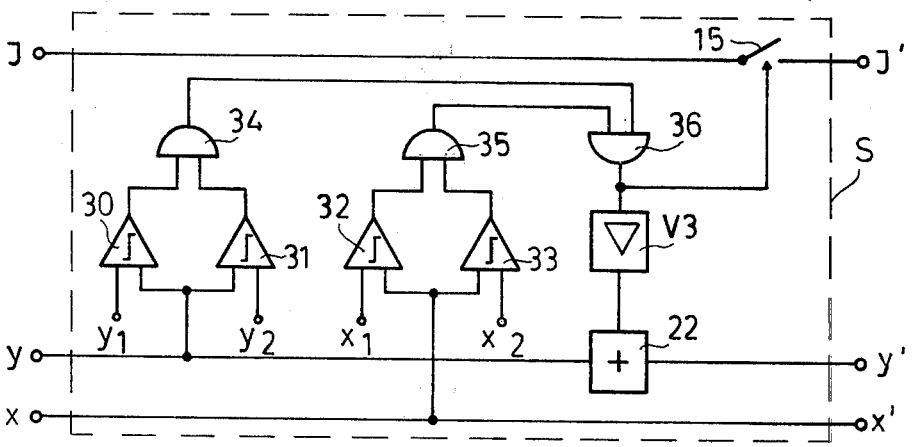
FIG. 4 is a schematic electrical diagram of a still another embodiment of an electronic control circuit for the microscope of FIG. 1.

FIG. 4 illustrates still another embodiment of an electronic control circuit for carrying out the method of the invention. Similar to the previously-described circuits, three input terminals and three output terminals are provided. The input terminal I is coupled by means of switch 15 to output terminal I'. Input terminal y is coupled to adder 22 and also to a pair of comparators 30 and 31. The input signal x is transmitted simultaneously to another pair of comparators 32 and 33. The output terminals of comparators 30 and 31 are coupled to an AND gate 34 and the output terminals of comparators 32 and 33 are coupled to AND gate 35. The output terminals of both of the AND gates 34 and 35 are coupled to another AND gate 36 whose output terminal is coupled to an amplifier V3 and switch 15. The output terminal of V3 is coupled to the other input terminal of adder 22.

The operation of the electronic control circuit shown in FIG. 4 is as follows:

Signals are generated at the output terminals of AND gates 34 and 35 only if the input signals x and y, respectively, have values which are disposed between predetermined settable fixed values $x_1$ and $x_2$, $y_1$ and $y_2$. In this situation, AND gate 36 generates an output signal which opens switch 15 and a signal $\Delta y$ is simultaneously transmitted by means of amplifier V3 to adder 22. As a result, the diffraction image is not scanned within the area of the image fixed by the values $x_1$, $x_2$ and $y_1$, $y_2$ due to the additional deflection $\Delta y$, and the television monitor 9 is simultaneously blanked. The size of this area which is not scanned can be changed as desired by varying the values of $x_1$, $x_2$, $y_1$ and $y_2$. In this way, a predetermined window is provided in which no scanning occurs.

It should be noted that although in all the embodiments of the electronic control circuit described thus far, the diffraction image is scanned over a detector by means of a deflection system disposed below the specimen, the method of the invention can also be carried out in a microscope not including such a deflection system. To achieve this, deflection system 3, which is utilized to effect scanning of the specimen in the microscope, is additionally excited so that the incident electron beam penetrates the specimen obliquely at different angles with respect to the microscope axis A, instead of only perpendicularly with respect to the specimen. In such a method, the angles at which the beam penetrates the specimen can be successively set so that the diffraction image is scanned over the beam detector in Cartesian coordinates. It also should be noted that the invention may be carried out in ion microscopes as well as transmission-type scanning microscopes.

In the foregoing specification, the invention has been described with reference to specific examplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a method for pictorially displaying a diffraction image in a transmission-type, scanning, corpuscular-beam microscope in which beam detector means is scanned by a diffraction image moved by deflection means in line-raster fashion in a first, predetermined direction over said beam detector means, said beam detector means generating an output signal for controlling the brightness of a television monitor for displaying said diffraction image, the improvement comprising the step of additionally exciting said deflection means so as to move said diffraction image in another second, predetermined direction over said beam detector means which is perpendicular to said first, predetermined direction so that a predetermined area of said diffraction image including at least part of the cross-section of maximum intensity of the null reflex of said beam is prevented from striking said beam detector means and is thereby excluded during scanning of said beam detector and said diffraction image displayed by said television monitor is blanked in an area corresponding to the cross-section of said diffraction image which is excluded during scanning.

2. The method recited in claim 1, wherein said step of additionally exciting comprises additionally exciting said deflection system by a fixed increment in an area of said diffraction image which is defined by the values $x_1 \leq x \leq x_2$ and $y_1 \leq y \leq y_2$, wherein $x_1$, $x_2$, $y_1$ and $y_2$ are predetermined, fixed values in said first, predetermined direction and said second, perpendicular direction, respectively, said deflection of said diffraction image in said first, perpendicular direction caused by said additional excitation of said deflection system being at least the increment $\Delta y = y_2 - y_1$.

3. The method recited in claim 1, wherein said step of additionally exciting comprises additionally exciting said deflection system when the intensity of said beam registered by said beam detector means exceeds a predetermined value.

4. The method recited in claim 3, wherein said step of additionally exciting further comprises additionally exciting said deflection system by a fixed increment for a fixed period of time.

5. The method recited in claim 3, wherein said step of additionally exciting said deflection system further comprises continuously increasing said additional excitation as long as the intensity at said beam detector means exceeds said predetermined value, and decreasing said additional excitation as soon as the intensity of said beam at said beam detector means decreases to a value which is below said predetermined value.

* * * * *